(12) United States Patent
Van Groos et al.

(10) Patent No.: US 7,576,831 B2
(45) Date of Patent: Aug. 18, 2009

(54) METHOD AND APPARATUS FOR MAINTAINING A MACHINE PART

(75) Inventors: Pieter Johannes Marius Van Groos, Eindhoven (NL); Jan Frederik Hoogkamp, Breda (NL); Josephus Cornelius Johannes Antonius Vugts, Waalwijk (NL); Robert Gordon Livesey, Haywards Heath (GB); Johannes Hendrikus Gertrudis Franssen, Eersel (NL); Albert Jan Hendrik Klomp, Eindhoven (NL); Johannes Petrus Martinus Bernardus Vermeulen, Helmond (NL); Erik Roelof Loopstra, Heeze (NL)

(73) Assignee: ASML Netherlands B.V., Veldhoven (NL)

( * ) Notice: Subject to any disclaimer, the term of this patent is extended or adjusted under 35 U.S.C. 154(b) by 1032 days.

(21) Appl. No.: 10/797,664

(22) Filed: Mar. 11, 2004

(65) Prior Publication Data

US 2005/0019709 A1 Jan. 27, 2005

(30) Foreign Application Priority Data

Mar. 11, 2003 (EP) ................................. 03075703
Jun. 2, 2003 (EP) ................................. 03076702

(51) Int. Cl.
*G03B 27/42* (2006.01)
*G03B 27/58* (2006.01)
(52) U.S. Cl. .......................................... 355/53; 355/72
(58) Field of Classification Search .................. 355/53, 355/72; 438/795; 257/678
See application file for complete search history.

(56) References Cited

U.S. PATENT DOCUMENTS

| 4,522,489 | A | 6/1985 | Bouwer |
| 5,186,718 | A | 2/1993 | Tepman et al. |
| 5,217,501 | A | 6/1993 | Fuse et al. |
| 5,229,872 | A | 7/1993 | Mumola |
| 5,296,891 | A | 3/1994 | Vogt et al. |
| 5,364,219 | A | 11/1994 | Takahashi et al. |
| 5,486,080 | A | 1/1996 | Sieradzki |
| 5,510,624 | A | 4/1996 | Zaluzec |
| 5,523,193 | A | 6/1996 | Nelson |

(Continued)

FOREIGN PATENT DOCUMENTS

EP   0 358 443 A2   3/1990

(Continued)

OTHER PUBLICATIONS

English translation of Japanese Official Action issued for Japanese Patent Application No. 2004-67549, dated Dec. 7, 2007.

(Continued)

*Primary Examiner*—Peter B Kim
(74) *Attorney, Agent, or Firm*—Sterne, Kessler, Goldstein & Fox P.L.L.C.

(57) ABSTRACT

A method of and apparatus for maintaining a machine part arranged in an interior space of a machine, where the interior space is kept at a first pressure and is separated from an environment having a second pressure via a load lock. The method includes transporting a machine part via the load lock out of the interior space and transporting via the load lock into the interior space one of the maintained machine part and a separate replacement machine part.

19 Claims, 3 Drawing Sheets

U.S. PATENT DOCUMENTS

| | | | |
|---|---|---|---|
| 5,559,584 A | 9/1996 | Miyaji et al. | |
| 5,563,683 A | 10/1996 | Kamiya et al. | |
| 5,730,573 A | 3/1998 | Masujima et al. | |
| 5,752,796 A | 5/1998 | Muka | |
| 5,825,470 A | 10/1998 | Miyai et al. | |
| 5,914,493 A | 6/1999 | Okino et al. | |
| 5,944,857 A | 8/1999 | Edwards et al. | |
| 5,969,441 A | 10/1999 | Loopstra et al. | |
| 6,031,598 A | 2/2000 | Tichenor et al. | |
| 6,046,792 A | 4/2000 | Van Der Werf et al. | |
| 6,059,507 A | 5/2000 | Adams | |
| 6,083,566 A | 7/2000 | Whitesell | |
| 6,234,107 B1 | 5/2001 | Tanaka et al. | |
| 6,281,510 B1 | 8/2001 | Yoshitake et al. | |
| 6,308,776 B1 | 10/2001 | Sloan et al. | |
| 6,315,512 B1 | 11/2001 | Tabrizi et al. | |
| 6,331,095 B1 | 12/2001 | Hiroki | |
| 6,342,941 B1 | 1/2002 | Shiraishi et al. | |
| 6,370,793 B1 | 4/2002 | Chae et al. | |
| 6,382,895 B1 | 5/2002 | Konishi et al. | |
| 6,399,518 B1 | 6/2002 | Ueda | |
| 6,404,483 B1 | 6/2002 | Segers et al. | |
| 6,485,248 B1 | 11/2002 | Taylor, Jr. | |
| 6,486,444 B1 | 11/2002 | Fairbairn et al. | |
| 6,537,012 B2 | 3/2003 | Kawahara et al. | |
| 6,562,141 B2 | 5/2003 | Clarke | |
| 6,609,869 B2 | 8/2003 | Aggarwal et al. | |
| 6,609,877 B1 | 8/2003 | Ramsay | |
| 6,721,035 B1 | 4/2004 | Segers et al. | |
| 6,740,891 B2 | 5/2004 | Driessen et al. | |
| 6,750,946 B2 | 6/2004 | Tanaka et al. | |
| 6,796,763 B2 | 9/2004 | Miyajima et al. | |
| 6,805,748 B1 | 10/2004 | Edo | |
| 6,846,149 B2 | 1/2005 | Savage et al. | |
| 6,866,468 B2 | 3/2005 | Moller et al. | |
| 6,906,783 B2 | 6/2005 | del Puerto et al. | |
| 7,024,266 B2 | 4/2006 | Edo | |
| 7,105,463 B2 | 9/2006 | Kurita et al. | |
| 7,123,349 B2 * | 10/2006 | Van Groos et al. | 355/72 |
| 7,359,031 B2 | 4/2008 | Klomp et al. | |
| 7,394,520 B2 | 7/2008 | Klomp et al. | |
| 2001/0016302 A1 | 8/2001 | Hirayanagi et al. | |
| 2001/0023522 A1 | 9/2001 | Watson et al. | |
| 2002/0011207 A1 | 2/2002 | Uzawa et al. | |
| 2002/0024645 A1 * | 2/2002 | Nakano | 355/53 |
| 2002/0052094 A1 | 5/2002 | Ryan et al. | |
| 2002/0074635 A1 | 6/2002 | Hattori et al. | |
| 2002/0081175 A1 | 6/2002 | Kawahara et al. | |
| 2002/0162574 A1 * | 11/2002 | Satou et al. | 134/10 |
| 2003/0002958 A1 | 1/2003 | Talmer | |
| 2003/0015290 A1 | 1/2003 | Edo | |
| 2003/0021671 A1 | 1/2003 | Edo | |
| 2003/0045131 A1 * | 3/2003 | Verbeke et al. | 438/795 |
| 2003/0082030 A1 | 5/2003 | Del Puerto et al. | |
| 2003/0082466 A1 | 5/2003 | del Puerto et al. | |
| 2004/0091349 A1 | 5/2004 | Tabrizi et al. | |
| 2004/0109152 A1 | 6/2004 | Hirayanagi | |
| 2004/0218168 A1 | 11/2004 | Van Groos et al. | |
| 2004/0263823 A1 | 12/2004 | Klomp et al. | |
| 2005/0054217 A1 | 3/2005 | Klomp et al. | |
| 2008/0138177 A1 | 6/2008 | Klomp et al. | |

FOREIGN PATENT DOCUMENTS

| | | | |
|---|---|---|---|
| EP | 1 282 157 A2 | 2/2003 | |
| EP | 1 341 042 A2 | 9/2003 | |
| EP | 1 282 157 A3 | 3/2004 | |
| EP | 1 341 042 A3 | 3/2004 | |
| JP | 03-180023 A | 8/1991 | |
| JP | 04-048716 A | 2/1992 | |
| JP | 7-204984 A | 8/1995 | |
| JP | 9-246347 A | 9/1997 | |
| JP | 10-092738 A | 4/1998 | |
| JP | 10-116760 A | 5/1998 | |
| JP | 11-135416 A | 5/1999 | |
| JP | 2001-015432 A | 1/2001 | |
| JP | 2001-118904 A | 4/2001 | |
| JP | 2001-210576 | 8/2001 | |
| JP | 2001-222099 A | 8/2001 | |
| JP | 2001-524267 T | 11/2001 | |
| JP | 2002-033264 A | 1/2002 | |
| JP | 2002-057100 | 2/2002 | |
| JP | 2002-075856 A | 3/2002 | |
| JP | 2002-517055 T | 6/2002 | |
| JP | 2002-246287 | 8/2002 | |
| JP | 2002-252155 | 9/2002 | |
| JP | 2003-023059 A | 1/2003 | |
| JP | 2003-031470 A | 1/2003 | |
| JP | 2003-031639 A | 1/2003 | |
| JP | 2003-045931 | 2/2003 | |
| JP | 2003-045947 A | 2/2003 | |
| JP | 2003-068819 A | 3/2003 | |
| JP | 2003-068828 | 3/2003 | |
| TW | 315488 | 9/1997 | |
| WO | WO 98/33096 | 7/1998 | |
| WO | WO 98/38597 | 9/1998 | |
| WO | WO 98/40791 | 9/1998 | |
| WO | WO 00/72375 A1 | 11/2000 | |
| WO | WO 01/20650 A1 | 3/2001 | |
| WO | WO 02/29495 A1 | 4/2002 | |
| WO | WO 02/052345 A1 | 7/2002 | |

OTHER PUBLICATIONS

European Search Report for EP 04075730.4 completed Jun. 25, 2004.

European Search Report for EP 03076702.4 completed Jan. 19, 2004.

European Search Report for App. No. EP04 07 5729 mailed Jun. 7, 2005, 7 pgs.

English Abstract for Japanese Publication No. JP 3-180023 published Aug. 6, 1991, 1 pg.

English Abstract for Japanese Publication No. JP 4-48716 published Feb. 18, 1992, 2 pgs.

English Abstract for Japanese Publication No. JP 10-92738 published Apr. 10, 1998, 2 pgs.

English Abstract for Japanese Publication No. JP 11-135416 published May 21, 1999, 2 pgs.

European Search Report in reference to 03 07 5703, dated Dec. 19, 2003.

Japanese Office Action issued for Japanese Patent Application No. 2004-067524, dated Apr. 13, 2007.

Singapore Office Action issued for Singapore Patent Application No. 200401159-9, dated May 4, 2007.

Taiwanese Official Action issued for Taiwanese Patent Application No. 093106320, dated May 29, 2007.

Examination Report for App. No. 04 075 729.6 mailed May 23, 2006, 6 pgs.

English translation of Korean Office Action and Korean Office Action for Application No. 10-2004-0016527 dated Oct. 31, 2005, 6 pgs.

English Translation of Japanese Office Action and Japanese Office Action for Patent Application No. 2004-067361 mailed May 9, 2007, 5 pgs.

English Abstract for Japanese Publication No. JP 10-116760 A published May 6, 1998, 1 pg.

English Abstract for Japanese Publication No. JP 2002-075856 A published Mar. 15, 2002, 1 pg.

English Abstract for Japanese Publication No. JP 2002-246287 A published Aug. 30, 2002, 1 pg.

English Abstract for Japanese Publication No. JP 2002-252155 A published Sep. 6, 2002, 1 pg.

English Abstract for Japanese Publication No. JP 2003-045931 A published Feb. 14, 2003, 1 pg.

English Abstract for Japanese Publication No. JP 2003-068828 A published Mar. 7, 2003, 1 pg.

English Translation of JP 09-246347 (dated Sep. 19, 1997), 20 pgs.

English Translation of JP 2001-222099 (dated Aug. 17, 2001), 18 pgs.

English Abstract for Japanese Publication No. JP 2001-015432 A published Jan. 19, 2001, 1 pg.

English Abstract for Japanese Publication No. JP 2002-033264 A published Jan. 31, 2002, 1 pg.

English Abstract for Japanese Publication No. JP 2003-023059 A published Jan. 24, 2003, 1 pg.

English Abstract for Japanese Publication No. JP 2003-031470 A published Jan. 31, 2003, 1 pg.

English Abstract for Japanese Publication No. JP 2003-068819 A published Mar. 7, 2003, 1 pg.

Office Action for Chinese Application No. 2004100326869 issued Apr. 4, 2008, 12 pgs.

Peter van Zant, *Microchip Fabrication: A Practical Guide to Semiconductor Processing*, Third Edition, McGraw Hill Publishing Co., 1997 (the whole book).

* cited by examiner

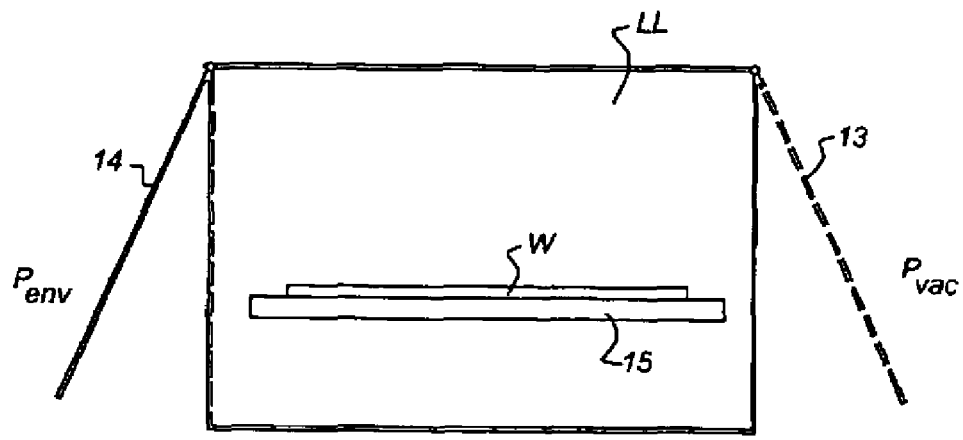
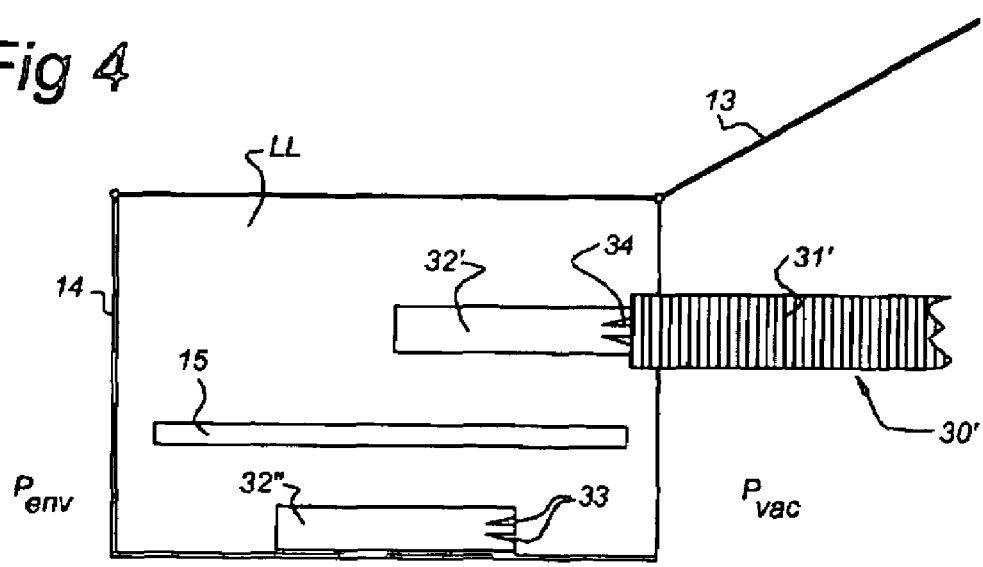

*Fig 5a*
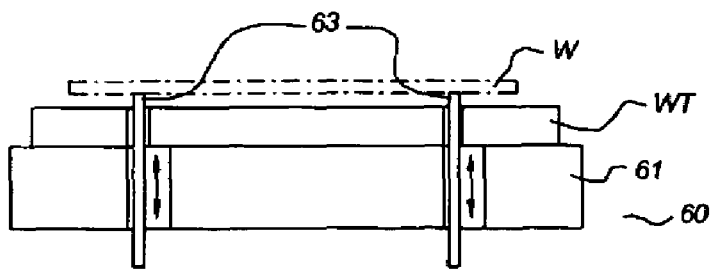
*Fig 5b*
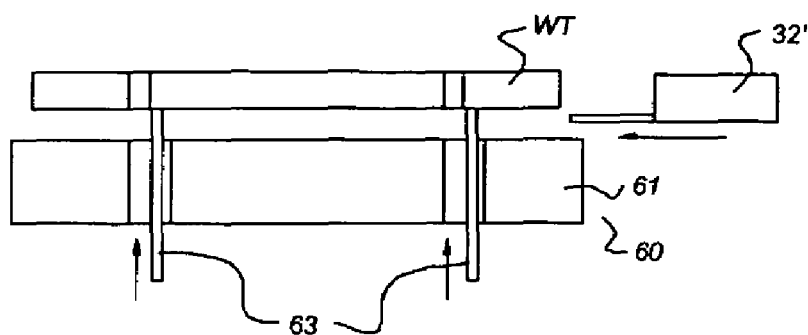
*Fig 6a*      *Fig 6b*
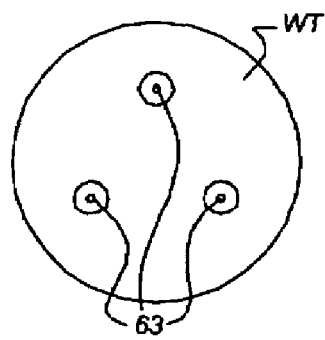 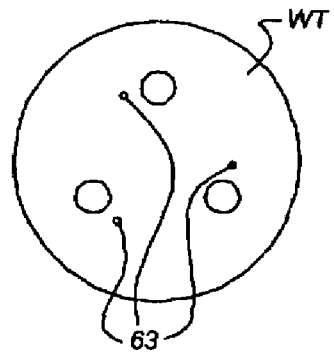
*Fig 7*
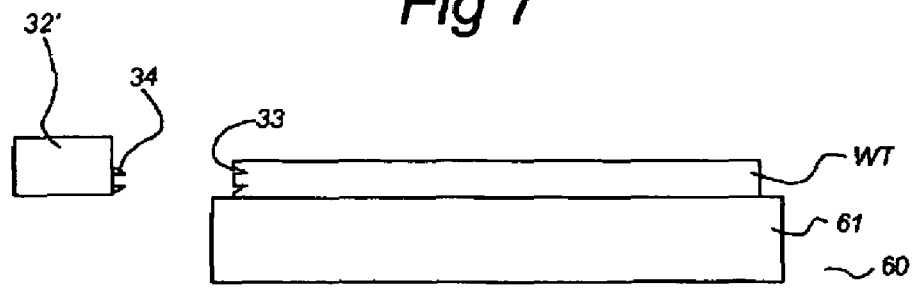

METHOD AND APPARATUS FOR MAINTAINING A MACHINE PART

The present invention claims priority from European Patent Application No. 03075703.3 filed Mar. 11, 2003 and European Patent Application No. 03076702.4 filed Jun. 2, 2003, the contents of each of which are incorporated herein in their entireties by reference.

FIELD OF THE INVENTION

The present invention relates to a method and apparatus for maintaining a machine part.

SUMMARY

The term "patterning device" as here employed should be broadly interpreted as referring to devices that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation devices. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic devices. In both of the situations described hereabove, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual device can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

In order to produce, for example, high quality chips with small features, the pattern used to create such chips needs to be correctly and accurately projected to the substrate. This means that the presence of contamination particles needs to be limited, since even a single contamination particle may disturb the correct projection of the pattern.

Before a substrate is exposed to the projection beam, it is coated with resist, handled by different handlers and placed in different process stations. Each process and handling step can generate contamination particles. These contamination particles can accumulate on grippers, that are handling the substrate, on pedestals and chucks, on which the substrate is positioned, etc.

A contamination particle that is in the path of the projection beam, e.g. on topside of the substrate, prevents the projected radiation from reaching the substrate. This will result in a projection error, often producing a chip with a defect.

On the other hand, a contamination particle on the bottom side of the substrate, i.e. the side on which the substrate rests, could cause the substrate to be wrongly positioned or could cause the substrate to bend. The same is true for contamination particles on the surface of a substrate carrier that supports the substrate. This could cause misalignment of the substrate and errors in the focusing of the projection beam, also possibly resulting in defective chips.

A maintenance procedure needs to be applied on a regular basis, in order to obtain optimal results of the lithographic projection apparatus. Such a maintenance procedure could comprises one or more activities, such as a cleaning procedure, a replacing procedure, a repairing procedure, and/or a replenishing (of expended items) procedure.

In most lithographic projection apparatus, measures are taken to reduce the generation and transportation of contamination particles. However, the presence of contamination particles in the lithographic projection apparatus can not yet be fully prevented. This is why every lithographic projection apparatus needs to be opened to undergo a cleaning procedure on a regular basis, which is a very time-consuming procedure.

Especially for lithographic projection apparatus using EUV radiation, opening the lithographic projection apparatus can be very time-consuming, since it involves destroying the vacuum condition likely found in such lithographic projection apparatus. After opening, the vacuum needs to be reestablished, which could take up to 24 hours. Furthermore, the cleaning process is a risky process. Opening the lithographic projection apparatus and cleaning it could be a contaminating procedure itself (e.g. fingerprints) or create defective parts.

Also, if a defective part of the lithographic projection apparatus needs to be replaced, the lithographic projection apparatus needs to be opened for maintenance. Again, this could result in contamination of or defects in the lithographic projection apparatus.

Thus, the maintenance process (e.g. cleaning, replacing, replenishing and/or repairing) can be a contaminating procedure or cause defects. Further, the maintenance process itself and/or re-establishing vacuum could take a long period.

Therefore, it is an aspect of the present invention to provide a method that minimizes the time needed for a maintenance procedure and minimizes the risk of contamination and/or defects due to the maintenance procedure itself. This and other aspects are achieved according to the invention in a method as specified in the opening paragraph, characterized by:

transporting a machine part via the load lock out of the interior space and transporting via the load lock into the interior space one of the maintained machine part and a separate replacement machine part. This method takes away the necessity of opening the interior of the machine and thereby disturbing the conditions that are maintained in the interior of the machine.

According to an embodiment of the invention, the method comprises:

cleaning the machine part outside the interior space to render it as the maintained machine part and transporting the maintained machine part via the load lock into the interior space. This method can preferably be applied in a situation where no replacement machine part is available to replace the part that is taken out for cleaning.

According to an embodiment of the invention, the separate replacement part is a clean version of the machine part and the separate replacement machine part is transported via the load lock into the interior space. This method can preferably be applied in situations where a spare part is available to replace the part that is taken out the machine. The machine can be used almost continuously with the replacement part. This ensures a higher throughput.

According to an embodiment of the invention, the machine part can be connected to and disconnected from the machine via a connection system. Such a connection system enables accurate pick up and delivery of the machine part.

According to an embodiment of the invention, the connection system is self-aligning during connecting and disconnecting. Such a self-aligning connection system could be formed by tapered protrusions that can connect to correspondingly shaped grooves. The self-aligning effect will be accomplished by the tapered shape and will ensure that the connection will be successful, even in case that the protrusions are not perfectly aligned with respect to the grooves.

According to an embodiment of the invention, the machine part is a substrate table and characterized by displacing a substrate table with respect to a chuck by a displacement mechanism. Such a displacement mechanism can be used to displace the substrate table with respect to the chuck, in order to allow easy pick-up of the substrate table.

According to an embodiment of the invention, displacing a substrate table with respect to a chuck comprises:

moving at least one of a pin, that in a first position extends in a first direction through the substrate table, and the substrate table in a second direction, which is substantially perpendicular to the first direction, when the pin is at a second position that does not extend through the substrate table; and displacing the substrate table with respect to the chuck by moving the pin in the first direction.

This method provides an easy and cost-effective way of receiving and/or providing a substrate table from or to a gripper.

According to an embodiment of the invention, the movement of the at least one of the pin and the substrate table in the second direction is a rotation. Rotating the pins with respect to the substrate table (or vice versa) is a space-saving embodiment of the invention.

According to an embodiment of the invention, the machine is a lithographic projection apparatus. The method can advantageously be used in the lithographic industry, since lithographic projection apparatus can comprise an interior space that is kept at a lower pressure than the environment. These apparatus are also very expensive and therefore, stopping the production in order to maintain the interior is very costly.

According to an embodiment of the invention, the machine part is at least one of a gripper arranged to grip and release a substrate and a substrate table arranged to support a substrate. These machine parts are particularly useful to transport in and out of the machine, since these machine parts have contact with the substrates and need therefore be kept as clean as possible.

According to a further aspect, the invention relates to an apparatus, comprising an interior space, where the interior space is kept at a first pressure and is separated from an environment having a second pressure via a load lock, characterized in that the apparatus is arranged to transfer a machine part via the load lock out of the interior space and is arranged to receive via the load lock into the interior space one of the maintained machine part and a separate replacement machine part.

According to an embodiment of the invention, the apparatus is a lithographic projection apparatus comprising:

a radiation system for providing a projection beam of radiation;

a support structure for supporting patterning device, the patterning device or patterning structure serving to pattern the projection beam according to a desired pattern;

a substrate table for holding a substrate; and a projection system for projecting the patterned beam onto a target portion of the substrate.

According to an embodiment of the invention, the apparatus is arranged to clean the machine part outside the interior space to render it as the maintained machine part and to transport the maintained machine part via the load lock into the interior space.

According to an embodiment of the invention, the separate replacement part is a clean version of the machine part and the apparatus is arranged to transport the separate replacement machine part via the load lock into the interior space.

According to an embodiment of the invention, the machine part can be connected to and disconnected from the machine via a connection system.

According to an embodiment of the invention, the connection system is self-aligning during connecting and disconnecting.

According to an embodiment of the invention, the machine part is a substrate table and further comprises a displacement mechanism to displace a substrate table with respect to a chuck.

According to an embodiment of the invention, the displacement mechanism comprises:

a pin, which in a first position can extend in a first direction through the substrate table, that can displace the substrate table with respect to the chuck through movement of the pin in the first direction; and a shifting mechanism that moves at least one of the pin and the substrate table in a second direction, which is substantially perpendicular to the first direction, when the pin is at a second position that does not extend through the substrate table.

According to an embodiment of the invention, the movement of the at least one of the pin and the substrate table in the second direction is a rotation.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

BRIEF DESCRIPTION OF DRAWINGS

Embodiments of the invention will now be described, by way of example only, with reference to the accompanying schematic drawings in which corresponding reference symbols indicate corresponding parts, and in which:

FIG. 3 schematically depicts a load lock according to an embodiment of the invention;

FIG. 4 schematically depicts a load lock according to an embodiment of the present invention;

FIGS. 5a and 5b schematically depict a substrate stage according to an embodiment of the present invention;

FIGS. 6a and 6b schematically depict a top view of a substrate table according to an embodiment of the invention; and FIG. 7 schematically depict a side view of a substrate table according to an embodiment of the invention.

DETAILED DESCRIPTION

Figure 1:
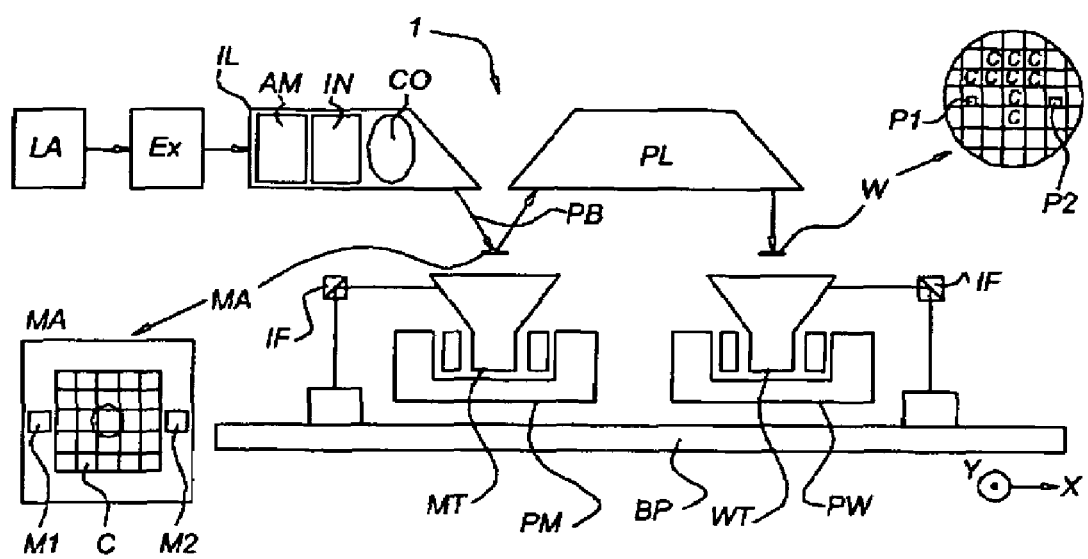
FIG. 1 depicts a lithographic projection apparatus according to an embodiment of the invention.

FIG. 1 schematically depicts a lithographic projection apparatus 1 according to a particular embodiment of the invention. The apparatus comprises:

a radiation system Ex, IL, for supplying a projection beam PB of radiation (e.g. EUV radiation). In this particular case, the radiation system also comprises a radiation source LA;

a first aspect table (mask table) MT provided with a mask holder for holding a patterning device, illustrated in the form of a patterning device, illustrated in the form of the mask MA (e.g. a reticle), and connected to first positioning device PM for accurately positioning the mask with respect to item PL;

a second aspect table (substrate table) WT provided with a substrate holder for holding a substrate W (e.g. a resist-coated silicon wafer), and connected to second positioning device PW for accurately positioning the substrate with respect to item PL; and a projection system ("lens") PL (e.g. a refractive or catadioptic system or a mirror group) for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask).

Alternatively, the apparatus may employ another kind of patterning device, such as a programmable mirror array of a type as referred to above.

The source LA (e.g. a Hg lamp, excimer laser, an undulator provided around the path of an electron beam in a storage ring or synchrotron, a laser plasma source or an electron or ion beam source) produces a beam of radiation. This beam is fed into an illumination system (illuminator) IL, either directly or after having traversed conditioning devices, such as a beam expander Ex, for example. The illuminator IL may comprise adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW (and interferometric measuring device IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the aspect tables MT, WT will be realized with the aid of a long-stroke module (coarse positioning) and a short-stroke module fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
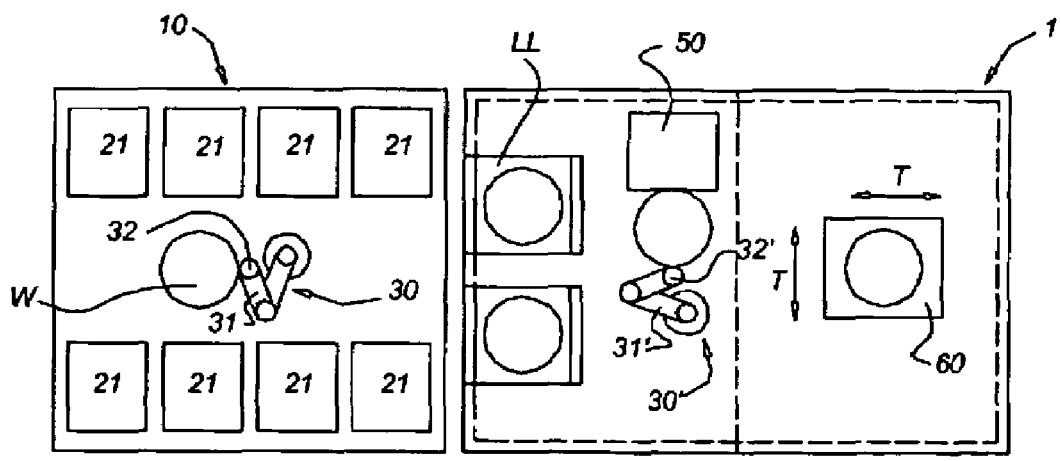
FIG. 2 depicts a schematic top view of a lithography cell comprising a lithographic projection apparatus and a track according to an embodiment of the invention.

FIG. 2 depicts a schematic view of the handling processes of a substrate W in a lithographic cell. The lithographic cell as shown in FIG. 2 comprises two main parts: the track 10 and the lithographic projection apparatus 1, as described, for example, with reference to FIG. 1. The substrates W can be moved from the track 10 to the lithographic projection apparatus 1 and vice versa through a load lock LL, of which two are shown in FIG. 2. Such a load lock LL is used to overcome the pressure difference between the track 10 and the lithographic projection apparatus 1, as is described below.

The substrates W are placed in so-called process stations 21, of which eight are shown in FIG. 2. In these process stations 21, the substrates W can be coated, but also other processes can be carried out, as will be known to a person skilled in the art. Such a process station 21 will be provided with a support structure (not shown), that supports the substrate W.

The substrates W can be taken out of a process station 21 by a first handler 30 positioned in the track 10. Such a handler 30 can comprise an armset 31, formed of different arm parts, that can rotate with respect to each other. At the extremity of the armset 31, a gripper 32 is provided, that can grip and release the substrate W as is generally known to a person skilled in the art. The first handler 30 picks up a substrate W from a process station 21 and delivers the substrate W to the load lock LL.

A second handler 30' that is positioned in the lithographic projection apparatus 1, picks up the substrate W on the other side of the load lock LL and transports it within the lithographic projection apparatus 1. The second handler 30' can move the substrate W to a pre-aligner 50 and/or to a substrate stage 60, comprising the substrate table WT, as is further described below with reference to FIG. 4. The pre-aligner 50 is used, for example, to accurately control the position of the substrate W with respect to the second handler 30'. Only when the relative position of the substrate W with respect to the second handler 30' is known, the second handler 30' can accurately position the substrate W on the substrate stage 60. The pre-aligner 50 is typically provided with a support structure to support the substrate W, i.e. a substrate table. The substrate stage 60 can be positioned (as indicated by the arrows T), in order to move the substrate W during an exposure and/or alignment procedure.

In order to create increasingly smaller patterns, radiation having increasingly smaller wavelengths, such as EUV radiation, is used for projecting the pattern on the substrate W. However, EUV radiation does not penetrate through matter, including gasses, so a lithographic projection apparatus 1 using EUV radiation maintains vacuum conditions $P_{vac}$, while a higher pressure, for instance an environmental pressure $P_{env}$ can be maintained in the track 10. Therefore, masks MA, substrates W and/or the like are moved in and out of the lithographic projection apparatus 1 using the load lock LL.

A schematic view of a load lock LL is depicted in FIG. 3. The load lock LL is formed by a wall enclosing an inner space. The load lock LL further comprises two doors, a first door 13 facing the lithographic projection apparatus 1 and a second door 14 facing the track 10. When both doors 13, 14 are closed, the pressure in the load lock LL can be adjusted, for instance by pumping or venting the load lock LL. FIG. 3 also shows a substrate W placed in the load lock LL. The load lock optionally has an intermediate floor 15, so substrates W can be positioned on the intermediate floor 15 and possibly on the bottom of the load lock LL.

When vacuum conditions $P_{vac}$ are obtained in the load lock LL, the first door 13 can be opened and, e.g., a substrate W can be delivered to and collected from the lithographic projection apparatus 1 by the second handler 30'. After the first door 13 has been closed, the load lock LL may be vented until environmental pressure $P_{env}$ is obtained. Then the second door 14 can be opened and a substrate W can be delivered to and collected from the track 10 by the first handler 30.

As already stated above, the generation of contamination particles can not fully be prevented. Therefore, the lithographic projection apparatus 1 needs to be maintained on a regular basis or as required. This typically means that the lithographic projection apparatus needs to be opened and, where applicable, the vacuum conditions destroyed. Re-establishing vacuum could take a long period. Furthermore, the maintenance process itself can also be a contaminating procedure or cause defects.

According to an embodiment of the invention, an alternative is provided for the maintenance process as described above. Instead of opening the lithographic projection apparatus 1 and possibly destroying the vacuum therein, parts of the lithographic projection apparatus 1 are arranged in such a way that they can be removed from the lithographic projection apparatus 1, via the load lock LL. This could be done with the existing load lock LL as described above, but it will be understood that this could also be done with a load lock LL that is specifically dedicated to this task, e.g. has bigger dimensions.

A part can thus be taken out of the lithographic projection apparatus 1 and can be maintained (e.g. cleaned, replenished or repaired), without opening the lithographic projection apparatus 1. During the maintenance procedure, the part can be replaced, via the load lock 11, by another replacement part (e.g. a new or previously maintained but different part). The lithographic projection apparatus 1 can thus continue working with the replacement part, while the removed part is maintained. Of course, replacement of the part during maintenance is not required. However, when no replacement is used the lithographic projection apparatus 1 may be out of order during the maintaining.

The machine part that is preferably taken out of the lithographic projection apparatus 1 is a part that has a contact surface with the substrate W or the mask MA during the processes described above. In an embodiment, the gripper 32' and the substrate table WT, are capable of being taken out of the lithographic projection apparatus 1 by the described method. As will be appreciated, other machine parts, such as expendable parts or parts capable of or prone to a defect, can be capable of being taken out of the lithographic projection apparatus 1 by the described method.

FIG. 4 shows a portion of the second handler 30', that delivers a gripper 32' to the load lock LL. The gripper 32' is connected to the armset 31' of the second handler 30' by the device of two protrusions 34 provided on the armset 31'. The protrusions engage with corresponding grooves provided on the gripper 32', as will be apparent, the protrusions may be provided on the gripper 32' and the grooves on the armset 31'. The parts can be kept together using all kinds of mechanisms, such as electric or magnetic forces. It will be understood that also other systems can be used to connect the gripper 32' and the armset 31'. The second handler 30' provides the gripper 32' to the intermediate floor 15.

A second gripper 32", provided on the load lock floor, is ready to be taken by the second handler 30'. The shape of the protrusions 34 and the grooves 33 is preferably chosen in such a way that a self-aligning effect is achieved. This means that even when the protrusions 34 are not perfectly aligned with the grooves 33 when the armset approaches the second gripper 32", the protrusions 34 will nevertheless enter the grooves 33 and will be guided to the desired position as a result of the shape of the grooves 33.

A similar procedure can be performed with the substrate table WT. The substrate table WT should therefore be made releasable from the substrate stage 60. In an embodiment, the substrate table, which is a portion that supports and is in contact with the substrate, may be displaced from a chuck, which supports the substrate table, so that a gripper can remove or provide the substrate table to the substrate stage. An advantage of such an arrangement is that no special connecting system may be required; the gripper can conventionally grasp the substrate table to raise or lower the substrate table from or to the chuck. The substrate table can be displaced (away from the chuck or towards the chuck) by any device, including without limitation a dedicated actuator, a releasable spring configuration, etc. Embodiment of such a substrate table displacement mechanism is described hereafter with respect to FIGS. 5a, 5b, 6a and 6b. Alternatively, the substrate table may be releasable but not displaced from the chuck. In such a case, the substrate table will likely have some form of connecting system in order to connect the gripper to the substrate table. The gripper then facilitates the displacement of the substrate table from or to the chuck. An embodiment of such a connecting system is described hereafter with respect to FIG. 7.

FIG. 5a shows a side view of a substrate stage 60 according to an embodiment of the invention. The substrate stage 60 comprises a chuck 61 and a substrate table WT. The substrate stage 60 is further provided with, preferably three or more pins 63 (of which only two are shown). The pins 63 extend in a substantially vertical direction through openings in the chuck 61 and the substrate table WT and can be moved in a substantially vertical direction, as indicated by the arrows. As can be seen in FIG. 5a, the openings in the substrate table WT have a somewhat smaller diameter than the openings in the chuck 61. The pins 63 are normally used to support a substrate W from a gripper 32' and lower and raise the substrate W to and from the substrate table WT and vice versa, as will be understood by a person skilled in the art.

According to an embodiment of the invention, the pins 63 can also be used to lift the substrate table WT from the chuck. The pins 63 are displaced horizontally by a shifting so they no longer align with the openings in substrate table WT. Alternatively or in addition, the substrate table WT itself may be displaced horizontally by a shifting mechanism. Since the openings in the substrate table WT have a somewhat smaller diameter than the openings in the chuck 61, this can be accomplished, as can be seen in FIG. 5b. If the pins 63 are moved in a substantially vertical direction, they raise the substrate table WT from the chuck 61. A gripper 32' can then take the substrate table WT off the pins 63 to further transport it, for example, to the load lock LL.

FIGS. 6a and 6b show another embodiment for lifting the substrate table WT from the chuck 61 using the pins 63. FIG. 6a shows a top view of the substrate table WT, showing three openings, through which the pins 63 can move in a substantially vertical direction. In order to lift the substrate table WT, the pins 63 should be moved in such a way that they no longer align with the openings provided in the substrate table WT. FIG. 6b shows that this can easily be achieved by rotating the pins 63 by a shifting mechanism. Of course, alternatively or in addition, the substrate table WT can be rotated by a shifting mechanism.

In the embodiments of FIGS. 5 and 6, the processes can be reversed so that the substrate table WT can be transported to the substrate stage 60 and lowered onto the chuck 61 using the pins 63.

According to a further embodiment depicted in FIG. 7, the gripper 32' is provided with protrusions 34 and the substrate table WT is provided with grooves 33. or vice versa. The protrusions 34 and grooves 33 are similar as already discussed with reference to FIG. 4. The gripper 32' can then engage with the substrate table WT and easily raise or lower the substrate table WT.

Whilst specific embodiments of the invention have been described above, it will be appreciated that the invention may be practiced otherwise than as described. The description is not intended to limit the invention.

The invention claimed is:

1. A method of maintaining a machine part arranged in an interior space of a machine, where the interior space is kept at a first pressure and is separated from an environment having a second pressure by a load lock, the method comprising:
    engaging the machine part with a first handler, wherein the first handler has either a plurality of tapered protrusions or a plurality of tapered grooves that substantially correspond to, respectively, a plurality of tapered grooves or a plurality of tapered protrusions located on the machine part;
    transporting the machine part from the interior space to the load lock using the first handler;
    disengaging the machine part from the first handler;
    engaging the machine part with a second handler, wherein the second handler has either a plurality of tapered protrusions or a plurality of tapered grooves that substantially correspond to, respectively, a plurality of tapered grooves or a plurality of tapered protrusions located on the machine part;
    transporting the machine part from the load lock to the environment using the second handler;
    disengaging the machine part from the second handler;
    performing maintenance on or replacement of the machine part;
    engaging the machine part with the second handler;
    transporting the maintained or replaced machine part from the environment to the load lock;
    disengaging the machine part from the second handler;
    engaging the machine part with the first handler; and
    transporting the maintained or replaced machine part from the load lock to the interior space;
    wherein the machine part is a substrate table configured to support a substrate or a gripper configured to grip and release the substrate and/or the substrate table.

2. The method of claim 1, wherein the machine part is transported from the environment through the load lock into the interior space after cleaning the machine part and the machine part is transported after being maintained from the environment through the load lock into the interior space.

3. The method of claim 1, wherein the separate replacement machine part is transported from the environment through the load lock into the interior space and the separate replacement machine part is a clean version of the machine part and the separate replacement machine part is transported from the environment through the load lock into the interior space as a clean version of the machine part.

4. The method of claim 1, where the machine part is connected to and disconnected from the machine via a connection system.

5. The method of claim 4, wherein the connection system self-aligns during connecting and disconnecting.

6. The method of claim 1, wherein the machine part is the substrate table and further comprising:
    displacing the substrate table with respect to a chuck by a displacement mechanism.

7. The method of claim 6, wherein displacing the substrate table with respect to the chuck comprises:
    moving at least one of a pin, that in a first position extends in a first direction through the substrate table, and the substrate table in a second direction, which is substantially perpendicular to the first direction, when the pin is at a second position that does not extend through the substrate table; and
    displacing the substrate table with respect to the chuck by moving the pin in the first direction.

8. The method of claim 7, wherein the movement of the at least one of the pin and the substrate table in the second direction is a rotation.

9. The method of claim 6, wherein displacing the substrate table by the displacement mechanism includes:
    providing the displacement mechanism having a pin, which in a first position can extend in a first direction through the substrate table, and that displaces the substrate table with respect to the chuck through movement of the pin in the first direction; and
    a shifting mechanism moving at least one of the pin and the substrate table in a second direction, which is substantially perpendicular to the first direction, when the pin is at a second position that does not extend through the substrate table.

10. The method of claim 9, where said movement of said at least one of the pin and said substrate table in said second direction is a rotation.

11. The method of claim 1, where the machine is a lithographic projection apparatus configured to project a beam of radiation on the substrate.

12. The method of claim 11, wherein the transporting the machine part includes grasping the gripper arranged to grip and release the substrate and/or the substrate table.

13. An assembly having an interior space maintained at a first pressure and an environment having a second pressure, comprising:
    a load lock separating the interior space from the environment;
    a first handler, located at a first side of said load lock, having a first plurality of tapered protrusions or tapered grooves that substantially correspond to and engage a second plurality of tapered grooves or tapered protrusions located on a machine part;
    a second handler, located at a second side of said load lock, having a third plurality of tapered protrusions or tapered grooves that substantially correspond to and engage the second plurality of tapered grooves or tapered protrusions of the machine part; and
    means for maintaining the first pressure when said load lock is open to the interior space,
    wherein said first handler is configured to transfer the machine part between the interior space to the load lock, and said second handler is configured to transfer the machine part between the load lock to the environment, and
    wherein the machine part comprises one of a substrate table configured to support a substrate and a gripper configured to manipulate at least one of the substrate and the substrate table.

14. The assembly of claim 13 wherein said assembly is a lithographic projection apparatus comprising:
    a radiation system configured to provide a beam of radiation;
    a support structure to support a patterning device, said patterning device serving to pattern said beam according to a desired pattern; and
    a projection system configured to project said patterned beam onto a target portion of said substrate.

15. The assembly of claim 13, further comprising:

a cleaning apparatus configured to clean said machine part outside said interior space to render it as said machine part after maintenance that can be transported from said environment into said interior space through said load lock.

16. The assembly of claim 13, wherein said separate replacement part is a clean version of said machine part that can be transported from said environment into said interior space through said load lock.

17. The assembly of claim 13, further comprising:

a connection system configured to connect and disconnect said machine part from said assembly.

18. The assembly of claim 17, wherein said connection system is configured to be self-aligning during connecting and disconnecting.

19. The assembly of claim 13, wherein said machine part is the substrate table and further comprising:

a displacement mechanism to displace the substrate table with respect to a chuck.

* * * * *